US006580654B2

(12) United States Patent
Foss et al.

(10) Patent No.: US 6,580,654 B2
(45) Date of Patent: Jun. 17, 2003

(54) BOOSTED VOLTAGE SUPPLY

(75) Inventors: Richard C. Foss, Scotland (CA); Peter B. Gillingham, Kanata (CA); Robert F. Harland, Carp (CA); Valerie L. Lines, Ottawa (CA)

(73) Assignee: Mosaid Technologies, Inc., Ontario (CA)

( * ) Notice: Subject to any disclaimer, the term of this patent is extended or adjusted under 35 U.S.C. 154(b) by 0 days.

(21) Appl. No.: 10/056,837

(22) Filed: Jan. 24, 2002

(65) Prior Publication Data

US 2002/0075706 A1 Jun. 20, 2002

Related U.S. Application Data

(60) Continuation of application No. 09/819,488, filed on Mar. 28, 2001, which is a continuation of application No. 09/483,626, filed on Jan. 14, 2000, now Pat. No. 6,236,581, which is a division of application No. 09/178,977, filed on Oct. 26, 1998, now Pat. No. 6,055,201, which is a continuation of application No. 08/921,579, filed on Sep. 2, 1997, now Pat. No. 5,828,620, which is a continuation of application No. 08/418,403, filed on Apr. 7, 1995, now abandoned, which is a continuation of application No. 08/134,621, filed on Oct. 12, 1993, now Pat. No. 5,406,523, which is a division of application No. 07/680,994, filed on Apr. 5, 1991, now Pat. No. 5,267,201.

(30) Foreign Application Priority Data

Apr. 6, 1990 (GB) ............................................. 9007791
Apr. 5, 1991 (GB) ............................................. 9107110

(51) Int. Cl.[7] ................................................ G11C 8/00
(52) U.S. Cl. .............. 365/226; 365/189.09; 365/230.06
(58) Field of Search ................ 363/59, 60; 365/189.09, 365/226, 230.06, 189.11, 203, 149; 327/589

(56) References Cited

U.S. PATENT DOCUMENTS 3,801,831 A   4/1974   Dame .......................... 307/251
3,942,047 A   3/1976   Buchanan .................... 307/297
3,980,899 A   9/1976   Shimada et al. ............. 307/238

(List continued on next page.)

FOREIGN PATENT DOCUMENTS

EP   0010137    4/1980
EP   9017505    10/1986
GB   2184902 A  10/1984

(List continued on next page.)

OTHER PUBLICATIONS

Ishihara, et al., "256k CMOS Dynamic RAM with Static Column Mode of Cycle Time of 50ns," Nikkei Electronics, Feb. 11 1985, pp. 243–263.

IBM Technical Disclosure Bulletin, "High Performance Complementary Decoder/Driver Circuit," V. 29, No. 6 (Nov. 1986).

IBM Technical Disclosure Bulletin, "Improved Decoder Circuits for CMOS Memory Arrays," V. 30, No. 2 (Jul. 1987).

(List continued on next page.)

*Primary Examiner*—Shawn Riley
(74) *Attorney, Agent, or Firm*—Hamilton, Brook, Smith & Reynolds, P.C.

(57) ABSTRACT

A circuit for providing an output voltage for a DRAM word line which can be used to drive memory word lines which can be as high as $2V_{dd}$. Transistors in a boosting circuit are fully switched, eliminating reduction of the boosting voltage by $V_{tn}$ through the transistors. The boosting capacitors are charge by $V_{dd}$. A regulator detects conduction current of a replica of a memory cell access transistor, shutting off the boosting circuit clock oscillator when the correct voltage to operate the access transistor has been reached.

6 Claims, 3 Drawing Sheets

U.S. PATENT DOCUMENTS

| | | | |
|---|---|---|---|
| 4,000,412 A | 12/1976 | Rosenthal et al. | 307/208 |
| 4,039,862 A | 8/1977 | Dingwall et al. | 307/247 R |
| 4,080,539 A | 3/1978 | Stewart | 307/264 |
| 4,189,782 A | 2/1980 | Dingwall | 365/190 |
| 4,208,595 A | 6/1980 | Gladstein | 307/296.2 |
| 4,271,461 A | 6/1981 | Hoffmann et al. | 363/60 |
| 4,279,010 A | 7/1981 | Morihisa | 363/60 |
| 4,307,333 A | 12/1981 | Hargrove | 323/313 |
| 4,344,005 A | 8/1982 | Stewart | 307/463 |
| 4,403,158 A | 9/1983 | Slemmer | 307/297 |
| 4,433,253 A | 2/1984 | Zapisek | 307/296.2 |
| 4,442,481 A | 4/1984 | Brahmbhatt | 363/60 |
| 4,486,670 A | 12/1984 | Chan et al. | 307/264 |
| 4,543,500 A | 9/1985 | McAlexander et al. | 307/530 |
| 4,581,546 A | 4/1986 | Allan | 307/297 |
| 4,583,157 A | 4/1986 | Kirsch et al. | 363/60 |
| 4,621,315 A | 11/1986 | Vaughn et al. | 363/60 |
| 4,628,214 A | 12/1986 | Leuschner | 307/296 R |
| 4,642,798 A | 2/1987 | Rao | 365/230 |
| 4,656,373 A | 4/1987 | Plus | 307/475 |
| 4,670,861 A | 6/1987 | Shu et al. | 365/181 |
| 4,689,504 A | 8/1987 | Rughunathan et al. | 307/449 |
| 4,692,638 A | 9/1987 | Stiegler | 307/449 |
| 4,697,252 A | 9/1987 | Furuyama | 365/189.09 |
| 4,716,313 A | 12/1987 | Hori et al. | 307/475 |
| 4,730,132 A | 3/1988 | Watanabe et al. | 307/446 |
| 4,740,918 A | 4/1988 | Okajima | 365/226 |
| 4,751,679 A | 6/1988 | Dehganpour | 365/201 |
| 4,798,977 A | 1/1989 | Sakui et al. | 307/446 |
| 4,807,190 A | 2/1989 | Ishii et al. | 365/189 |
| 4,811,304 A | 3/1989 | Matsuda et al. | 365/233 |
| 4,814,647 A | 3/1989 | Tran | 307/482 |
| 4,837,462 A | 6/1989 | Watanabe et al. | 307/446 |
| 4,843,256 A | 6/1989 | Scade et al. | 307/296.2 |
| 4,857,763 A | 8/1989 | Sakurai et al. | 307/443 |
| 4,873,673 A | 10/1989 | Hori et al. | 365/230.06 |
| 4,878,201 A | 10/1989 | Nakaizumi | 365/203 |
| 4,881,201 A | 11/1989 | Sato | 365/189.09 |
| 4,888,738 A | 12/1989 | Wong et al. | 365/218 |
| 4,906,056 A | 3/1990 | Taniguchi | 307/482 |
| 4,920,280 A | 4/1990 | Cho et al. | |
| 4,951,259 A | 8/1990 | Sato et al. | 365/230.06 |
| 4,961,007 A | 10/1990 | Kumanoya et al. | 307/296.2 |
| 5,010,259 A | 4/1991 | Inoue et al. | 307/482 |
| 5,018,107 A | 5/1991 | Yoshida | 365/230 |
| 5,023,465 A | 6/1991 | Douglas et al. | 365/203 |
| 5,031,149 A | 7/1991 | Matsumoto et al. | 365/189.11 |
| 5,038,325 A | 8/1991 | Douglas et al. | 365/189.06 |
| 5,038,327 A | 8/1991 | Akaogi | 365/230.06 |
| 5,059,815 A | 10/1991 | Bill et al. | 307/246 |
| 5,086,238 A | 2/1992 | Watanabe et al. | 307/296.6 |
| 5,101,381 A | 3/1992 | Kouzi | 365/185.21 |
| 5,103,113 A | 4/1992 | Inui et al. | 307/270 |
| 5,150,325 A | 9/1992 | Yanagisawa et al. | 365/177 |
| 5,159,215 A | 10/1992 | Murotani | 307/449 |
| 5,197,033 A | 3/1993 | Watanabe et al. | 365/226 |
| 5,208,776 A | 5/1993 | Nasu et al. | 365/200 |
| 5,262,999 A | 11/1993 | Etoh et al. | 365/226 |
| 5,264,743 A | 11/1993 | Nakagome et al. | 307/473 |
| 5,276,646 A | 1/1994 | Kim | 365/189.09 |
| 5,297,097 A | 3/1994 | Etoh et al. | 365/226 |
| 5,307,315 A | 4/1994 | Oowaki et al. | 365/189.09 |
| 5,311,476 A | 5/1994 | Kajimoto et al. | 365/222 |
| 5,323,354 A | 6/1994 | Matsumoto et al. | 365/229 |
| 5,337,284 A | 8/1994 | Cordoba et al. | 327/545 |
| 5,347,488 A | 9/1994 | Matsushita | 365/189.11 |
| 5,351,217 A | 9/1994 | Jeon | 365/230.06 |
| 5,377,156 A | 12/1994 | Watanabe et al. | 365/227 |
| 5,699,313 A * | 12/1997 | Foss et al. | 327/589 |
| 5,751,643 A | 5/1998 | Lines | 365/189.11 |
| 5,912,564 A | 6/1999 | Kai et al. | 326/68 |
| 6,055,201 A * | 4/2000 | Foss et al. | 365/226 |
| RE37,593 E * | 3/2002 | Etoh et al. | 365/189.09 |
| 6,421,295 B1 * | 7/2002 | Mao et al. | 365/230.06 |

FOREIGN PATENT DOCUMENTS

| | | |
|---|---|---|
| GB | 2204456 A | 5/1988 |
| JP | 56-62066 | 5/1981 |
| JP | 1981-62066 | 5/1981 |
| JP | 59-213090 | 12/1984 |
| JP | 62-021323 | 1/1987 |
| JP | 62-178013 | 8/1987 |
| JP | 62-189816 | 8/1987 |
| JP | 63-292488 | 11/1988 |
| JP | 3-23590 | 1/1991 |
| JP | 30-23590 | 1/1991 |
| WO | WO86/04724 | 10/1986 |

OTHER PUBLICATIONS

Kitsukawa, G., et al., "An Experimental 1–Mbit BiCMOS DRAM," *IEEE Journal of Solid–State Circuits*, SC–22: (5) 657–662 (1987). no month.

Bursky, D., "Memory ICs," *Electronic Design*, V. 36, No. 4, p. 70 (Feb. 1988).

Fujii, S., et al., "A 45–ns 16Mb DRAM with Triple–Well Structure," *1989 IEEE International Solid–State Circuits Conference, Session 16: Dynamic RAMs*, pp. 248–249 (Feb. 1989).

Watanabe, T., et al., "Comparison of CMOS and BiCMOS 1–Mbit DRAM no month Performance," *IEEE Journal of Solid–State Circuits*, 24 : (3) 771–778 (1989).

Fujii, S., et al., "A 45–ns 16–Mbit DRAM with Triple–Well Structure," *IEEE Journal of Solid–State Circuits*, 24 : (5) 1170–1174 (1989). no month.

Nakagome, Y., et al., "A 1.5V Circuit Technology for 64Mb DRAMs," 1990 Symposium on VLSI Circuits, Tokyo, Japan, pp. 17–18 (1990). no month.

Kitsukawa, G., et al., "A 23–ns 1–Mb BiCMOS DRAM," *IEEE Journal of Solid–State Circuits*, 25: (5) 1102–1111 (1990). no month.

Bursky, D., "Digital Techonology," *Electronic Design*, 40 : (4) 48–61 (Feb. 1992).

Gillingham, P. et al., "High–Speed High–Reliability Circuit Design for Megabit DRAM," *IEEE Journal of Solid–State Circuits*, 26 : (8) 1171–1175 (1991). no month.

Nakagome, Yoshinobu et al., "An Experimental 1.5–V 64–Mb DRAM," IEEE Journal of Solid–State Circuits, vol. 26, No. 4, Apr. 1991, pp. 465–472.

Kitsukawa, Goro et al., "A 1–Mbit BiCMOS DRAM Using Temperature–Compensation Circuit Techniques," IEEE Journal of Solid–State Circuits, vol. 24, No. 4, Jun. 1989, pp. 597–601.

Ishihara, Masanori, et al., "256K CMOS Dynamic RAM With Static Column Mode of Cycle Time of 50ns," Nikkei Electronics, Feb. 11, 1985, pp. 243–263. (translation).

MOSAID, INC. "An Analysis of the Toshiba TC511000/ TC511001 CMOS 1Mx1 DRAMs," MOSAID Design Analysis Report Service, Aug. 1986.

* cited by examiner

BOOSTED VOLTAGE SUPPLY

RELATED APPLICATIONS

This application is a Continuation of application Ser. No. 09/819,488, filed Mar. 28, 2001, which is a Continuation of application Ser. No. 09/483,626, filed Jan. 14, 2000, now U.S. Pat. No. 6,236,581 which is a is a Divisional of Ser. No. 09/178,977, filed Oct. 26, 1998, now U.S. Pat. No. 6,055, 201 which is a Continuation of Ser. No. 08/921,579, filed Sep. 2, 1997, now U.S. Pat. No. 5,828,620 which is a File Wrapper Continuation of Ser. No. 08/418,403, filed Apr. 7, 1995, now Abandoned which is a Continuation of Ser. No. 08/134,621, filed Oct. 12, 1993, now U.S. Pat. No. 5,406, 523 which is a Divisional of Ser. No. 07/680,994, filed Apr. 5, 1991, now U.S. Pat. No. 5,267,201 which relates to United Kingdom Application Nos. 9107110.0 filed Apr. 5, 1991 and 9007791.8 filed Apr. 6, 1990.

The entire teachings of the above applications are incorporated herein by reference.

FIELD OF THE INVENTION

This invention relates to dynamic random access memories (DRAMs) and in particular to a boosted word line power supply charge pump and regulator for establishing word line voltage.

BACKGROUND TO THE INVENTION

High density commercial DRAMS typically use capacitive pump voltage boosting circuits for providing sufficiently high voltage to drive DRAM word lines. Regulation of the voltage has been poor, and danger exists of generating voltages above the limits imposed by reliability requirements of the device technology. Such circuits, where a supply voltage of $V_{dd}$ is present, generate a maximum achievable voltage of $2V_{dd}-V_{tn}$ where $V_{tn}$ is the threshold voltage of an N-channel field effect transistor (FET).

DESCRIPTION OF THE PRIOR ART

FIG. 1 illustrates a voltage boosting circuit according to the prior art and FIG. 2 illustrates clock signal waveforms used to drive the circuit.

A pair of N-channel transistors 1 and 2 are cross-coupled to form a bistable flip-flop, the sources of the transistors being connected to voltage rail $V_{dd}$. The drain of each transistor, is connected to the gate of the respective other transistor, and form nodes 3 and 4 which are connected through corresponding N-channel transistors 5 and 6 configured as diodes, to one terminal of a capacitor 7. The other terminal of capacitor 7 is connected to ground.

A clock source is connected through an inverter 8 and via capacitor 9 to node 4, and another clock source is connected through an inverter 10 through capacitor 11 to node 3.

The clock source voltage at the output of inverter 8 is shown as waveform $\phi_2$, varying between voltages $V_{dd}$ and $V_{ss}$, and the clock source output at the output of inverter 10 is shown as waveform $\phi_1$, varying between the voltages $V_{dd}$ and $V_{ss}$.

The output terminal of the circuit supplies the voltage $V_{pp}$ at the junction of the capacitor 7 and transistors 5 and 6.

Operation of the above-described circuit is well known. As the levels of $\phi_1$ and $\phi_2$ vary as shown in FIG. 2, capacitors 9 and 11 alternately charge between $V_{ss}$ and $V_{dd}$ and discharge to capacitor 7. The maximum achievable voltage at the output terminal is $2V_{dd}-V_{tn}$, where $V_{tn}$ is the threshold of operation of either of transistors 5 or 6.

It should be noted that the external supply voltage $V_{dd}$ can vary between limits defined in the device specification, and also as a result of loading, both static and dynamic of other circuits using the same supply. The threshold voltage $V_{tn}$ is sensitive to variations in semiconductor processing, temperature and chip supply voltage, and this contributes to significant variation in the boosted supply. Finally the boosted $V_{pp}$ supply itself varies as a function of load current drawn from capacitor 7. Therefore the voltage at the output terminal, which is supposed to provide a stable word line voltage can vary substantially from the ideal. For example, if $V_{dd}$ is excessively high, this can cause the output voltage to soar to a level which could be damaging to word line access transistor gate insulation, damaging the memory. If $V_{dd}$ is low, it is possible that insufficient output voltage could be generated to drive the memory cell access transistors, making memory operation unreliable.

SUMMARY OF THE PRESENT INVENTION

The present invention is a circuit for providing an output voltage which can be used to drive memory word lines which can be as high as $2V_{dd}$; it does not suffer the reduction of $V_{tn}$ of the prior art circuit. Thus even if $V_{dd}$ is low, the word line driving voltage even in the worst case would be higher than that of the prior art, increasing the reliability of operation of the memory.

The above is achieved by fully switching the transistors in a boosting circuit, rather than employing N-channel source followers as "diodes". This eliminates reduction of the boosting voltage by $V_{tn}$.

Another embodiment of the invention is a circuit for detecting the required word line driving voltage and for regulating the voltage boosting pump by enabling the pump to operate if the boosted voltage is low, causing the word line driving voltages to increase, and inhibiting the pump if the voltage reaches the correct word line voltage. This is achieved by utilizing a sample transistor which matches the memory cell access transistor which is to be enabled from the word line. The word line driving voltage is applied to the sample transistor, and when it begins to conduct current indicating that its threshold of operation has been reached, a current mirror provides an output voltage which is used in a feedback loop to inhibit operation of the voltage pump. Since the sample transistor is identical to the memory access transistor, the exactly correct word line driving voltage is maintained.

Thus accurate regulation of the boosted word line voltage is produced, without the danger of damaging voltages. Because once the correct word line driving voltage is reached, the voltage pump is inhibited, there is no additional power required to charge voltage boosting capacitors higher than this point, saving power. Since the voltage that is exactly that required is generated, improved reliability is achieved because double boot-strap voltages on the chip are eliminated. The circuit is thus of high efficiency.

The first and second embodiments are preferred to be used together, achieving the advantages of both.

The same basic design could also be employed as a negative substrate back-bias voltage ($V_{bb}$) generator.

An embodiment of the invention is a boosted voltage supply comprising a D.C. voltage supply terminal, first and second capacitors, the first capacitor having one terminal connected to ground and its other terminal to an output terminal, switching apparatus for connecting one terminal of the second capacitor alternately between the voltage supply terminal and ground and connecting the other terminal of the second capacitor alternately between the voltage supply terminal and the output terminal, whereby a boosted voltage regulated to the D.C. voltage supply is provided at the output terminal.

Another embodiment of the invention is a dynamic random access (DRAM) word line supply comprising an increasing voltage supply for the word line for connection to the word line from time to time, a memory cell access transistor for connecting a memory cell capacitor to a bit line having a gate connected to the word line, a sample transistor similar to the memory cell access transistor, apparatus for applying the voltage supply to the sample transistor for turning on the sample transistor at a supply voltage related to the characteristics of the sample transistor, and apparatus for inhibiting increase of the voltage supply upon turn-on of the sample transistor, whereby a voltage supply having a voltage level sufficient to turn-on the memory cell access transistor is provided for connection to the word line.

BRIEF INTRODUCTION TO THE DRAWINGS

A better understanding of the invention will be obtained by reference to the detailed description below, in conjunction with the following drawings, in which.

DETAILED DESCRIPTION OF THE INVENTION

Figure 3:
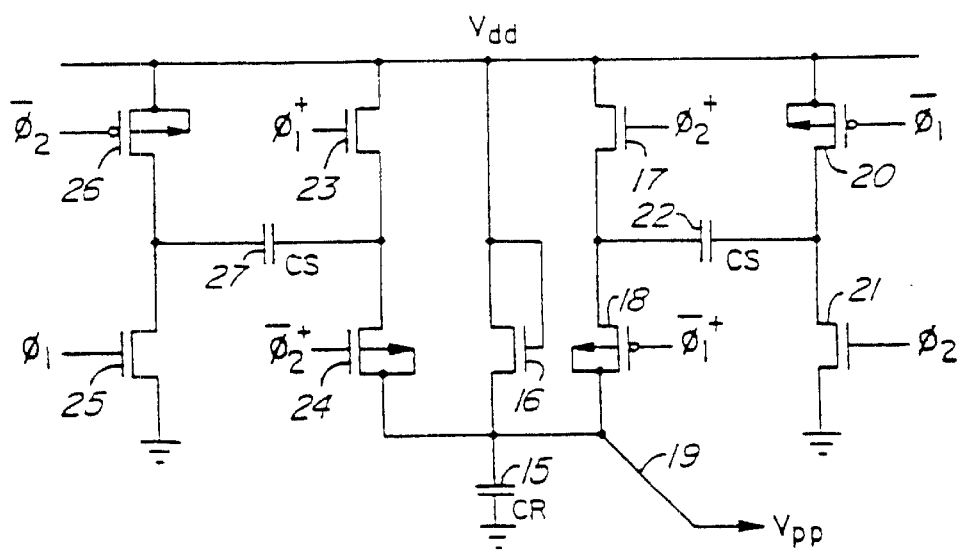
FIG. 3 is a schematic diagram of an embodiment of the present invention.

With reference to FIG. 3, a capacitor 15 is connected in a series circuit between ground and through an N-channel field effect transistor FET 16, configured as a diode, with gate and drain connected to a voltage source $V_{dd}$. Transistor 16 charges capacitor 15 to $V_{dd}$ with an N-channel threshold ($V_{tn}$) of $V_{dd}$ upon startup.

A first pair of transistors formed of N-channel FET 17 and P-channel FET 18 are connected with their source-drain circuits in series between the junction of transistor 16 and capacitor 15 and $V_{dd}$, the source of transistor 18 being connected with its substrate to the junction of transistor 16 and capacitor 15. That junction forms the output 19 of the circuit, where the voltage $V_{pp}$, the word line supply, is provided.

A second pair of transistors, one being P-channel FET 20 and one being N-channel FET 21 have their source-drain circuits connected in series between the voltage supply $V_{dd}$ and ground. The source of transistor 20 is connected to voltage supply $V_{dd}$ with its substrate. A second capacitor 22 is connected between the junctions of the two pairs of transistors.

While the above-described circuit would operate in a manner to be described below to generate a voltage $2V_{dd}$ at the output 19, it provides only a half wave boosting function, and should significant current be drawn, the voltage could drop. In order to provide a full wave boosting function, an additional circuit is included as follows.

A third pair of transistors comprising N-channel FET 23 and P-channel FET 24 have their source-drain circuits connected in series between $V_{dd}$ and the output terminal 19, the source of transistor 24 being connected to the output terminal with its substrate. A fourth pair of FETs comprised of P-channel FET 24 and N-channel FET 25 have their source-drain circuits connected in series between $V_{dd}$ and ground, the source of transistor 24 being connected to $V_{dd}$ with its substrate. A third capacitor 27 is connected between the junctions of the third and fourth pairs of transistors.

Clock sources are applied to the gates of the various transistors as follows: $\phi_1$ to the gate of transistor 25, $/\phi_1$ to the gate of transistor 20, $\phi_2$ to the gate of transistor 21, and $/\phi_2$ to the gate of transistor 26.

Boosted clock signals are applied to the gates of the various transistors as follows: $\phi_1+$ to the gate of transistor 23, $/\phi_1$ to the gate of transistor 18, $\phi_2+$ to the gate of transistor 17 and $/\phi_2+$ to the gate of transistor 24.

Figure 5:
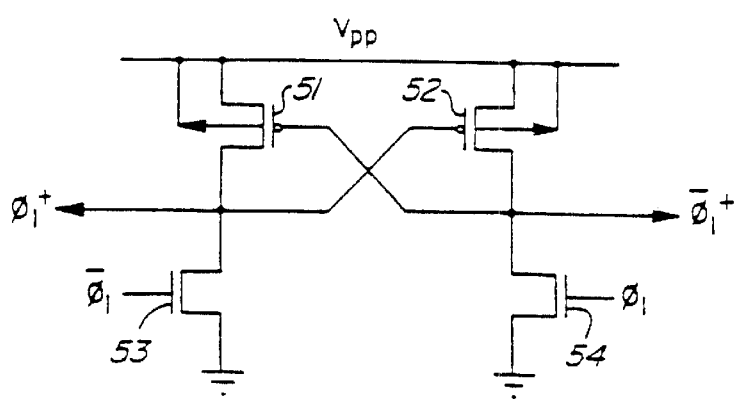
FIG. 5 is a schematic diagram of a boosted clock generator.

A schematic of a clock generator is shown in FIG. 5. P-channel transistors 51 and 52 are cross-coupled to form a bistable flip-flop, the sources and substrates of the transistors being connected to the $V_{pp}$ output 19, the gate of transistor 52 being connected to the drain of transistor 51 and the gate of transistor 51 being connected to the drain of transistor 52. N-channel transistor 53 has its source-drain circuit connected between the drain of transistor 51 and ground and N-channel transistor 54 has its source-drain circuit connected between the drain of transistor 52 and ground. The clock $\phi_1$ is applied to the gate of transistor 54 and the clock $/\phi_1$ is applied to the gate of transistor 53.

When the clock $\phi_1$ goes high, transistor 54 is enabled and the junction of transistors 52 and 54 is pulled to ground, enabling transistor 51 which passes $V_{pp}$ to the junction of transistors 51 and 53. This is the clock $\phi_1+$, boosted to $V_{pp}$. When the clock $\phi_1$ goes low, and $/\phi_1$ goes high, transistor 54 is inhibited and transistor 53 is enabled and the junction of transistors 51 and 53 ($\phi_1+$) is pulled to ground. This enables transistor 52 which passes $V_{pp}$ to the junction of transistors 52 and 54, the clock $/\phi_1+$ output.

A similar circuit (not shown) provides boosted clocks $\phi_2+$ and $\phi_2+$.

Figure 4:
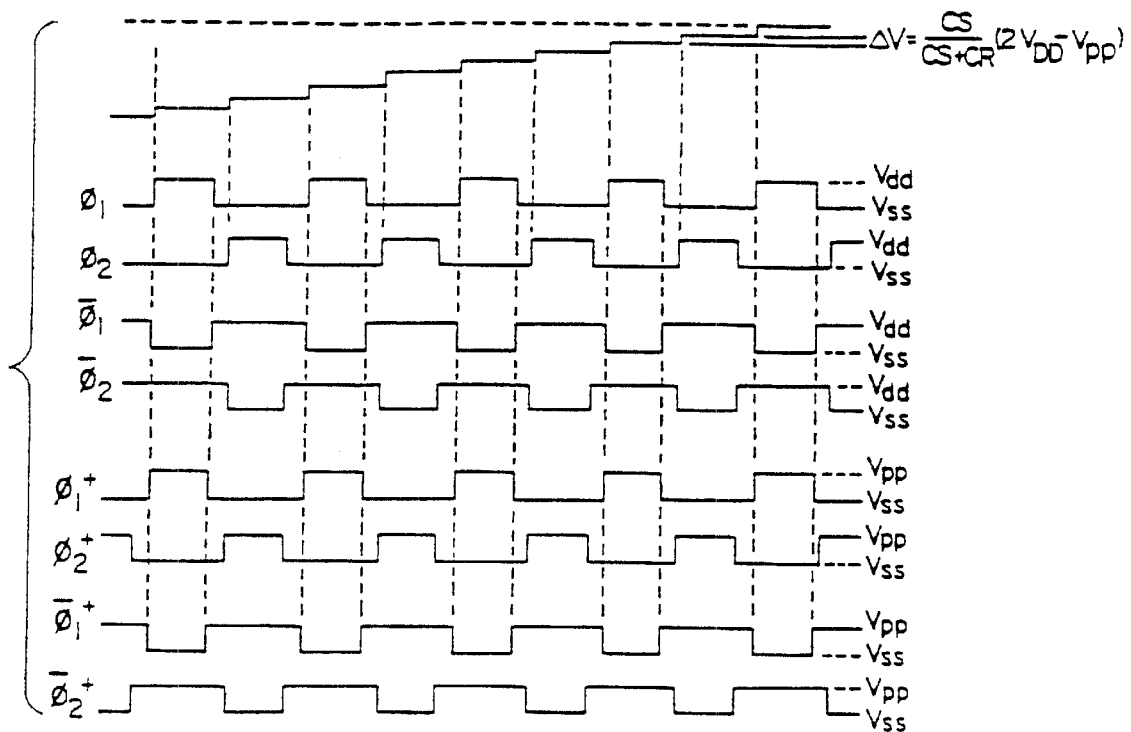
FIG. 4 illustrates clock signal waveforms used to operate the circuit of FIG. 3.

FIG. 4 illustrates the clock signal logic levels and timing which are applied to the various gates, and reference is made thereto for the explanation below.

In operation, at initialization, capacitor 15 is charged through the N-channel FET diode 16 from $V_{dd}$, charging it up to $V_{dd}-V_{tn}$. The circuit then goes through a number of cycles to charge up reservoir capacitor 15 to the required level. The following discussion describes the voltages and charge transfers occurring in the pump circuit once the $V_{pp}$ level has almost reached the desired level, and is sufficient to fully turn on an N-channel transistor with its source at $V_{dd}$.

Now considering the switching circuit for capacitor 27 to the left of diode 16, and the waveforms of FIG. 4, $\phi_1$ and $/\phi_1+$ go high, enabling transistors 23 and 25. Capacitor 27 charges to the level of $V_{dd}$. Transistors 23 and 25 are then inhibited, ceasing conduction at the end of the $\phi_1$ pulse.

After a discrete period of time, $/\phi_2$ and $/\phi_2+$ go low and transistors 24 and 26 are enabled. The capacitor terminal which was connected to $V_{dd}$ becomes connected to output terminal 19 and the other, negative terminal of capacitor 27 becomes connected to $V_{dd}$. If capacitance $C_R$ (15) was equal to 0, the voltage from the positive terminal of capacitor 27, at terminal 19 to ground would be equal to the initial voltage on capacitor 27 plus the voltage $V_{dd}$ to ground, i.e. $2V_{dd}$.

However, reservoir capacitor $C_R$ (15) typically has a large value so that the voltage step at node 19 will be attenuated to $(C_S/(C_S+C_R))*(2V_{dd}-V_{pp})$, where $C_R$ and $C_S$ are the values of capacitors 15 and 22 or 27 respectively. Thus the pump can attain a maximum level of $2V_{dd}$.

The voltage pulses $/\phi_2$ and $/\phi_2+$ then go high, inhibiting transistors 23 and 25, and after a discrete period of time $\phi_1$ and $/\phi_1+$ go high again, reconnecting capacitor 27 between $V_{dd}$ and ground. Again it charges, and as capacitor 27 is alternately switched between $V_{dd}$ and ground and output terminal 19 and $V_{dd}$, the voltage between terminal 19 and ground rises to $2V_{dd}$.

A similar function occurs with capacitor 22. When the clock voltage $/\phi_1$ and $/\phi_1+$ go low, capacitor 27 is connected between terminal 19 and $V_{dd}$ through transistors 20 and 18. When the clock voltages $\phi_2$ and $\phi_2+$ go high, capacitor 22 is connected between $V_{dd}$ and ground via transistors 17 and 21, charging capacitor 22 to the voltage $V_{dd}$. Thus, while capacitor 27 is being charged between $V_{dd}$ and ground, capacitor 22 is connected between output terminal 19 and $V_{dd}$ through FETs 20 and 18, due to the phase and polarity of the clock signals $/\phi_1$. The two capacitors 27 and 22 thus alternately charge and boost the voltage on capacitor 15.

The clock signals $\phi_1$, $\phi_2$, $/\phi_1$ and $/\phi_2$ have similar amplitudes, and vary between $V_{dd}$, a logic 1, and a $V_{ss}$, a logic zero.

The clock signals $\phi_1+$, $\phi_2+$, $/\phi_1+$ and $/\phi_2+$ have similar amplitudes, and vary between $V_{pp}$, a logic 1, and $V_{ss}$ (ground), and logic 0.

Figure 1:
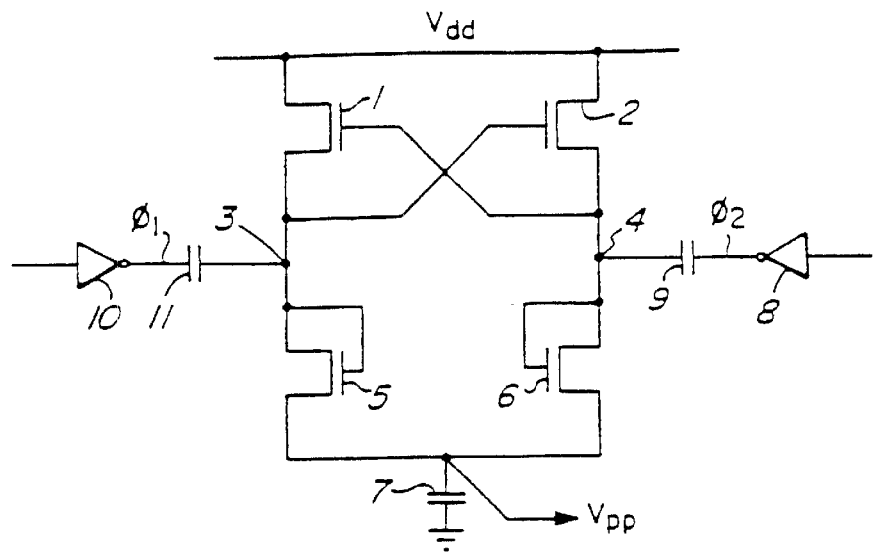
FIG. 1 is schematic diagram of a prior art voltage boosting circuit.
Figure 2:
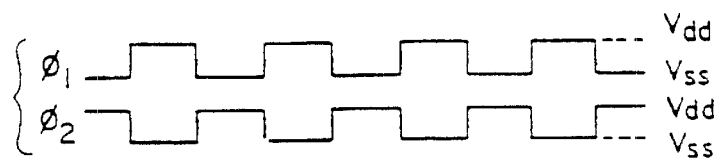
FIG. 2 illustrates clock waveforms used to drive the circuit of FIG. 1.

It should be noted that the capacitors 15, 22 and 27 charge from the main voltage supply $V_{dd}$, and not from the clock sources. This allows the clock sources to have reduced power supply requirements, since they drive only the gates of the FETs which have minimal capacitance. This is in contrast to the prior art boosting circuit in which the clock sources supply the charge required for capacitors 9 and 11 (FIG. 1), and thus supply the current required to boost the voltage, indirectly supplying part of the word line current.

In addition, since the voltage boosting current is not routed through an FET configured as a diode, as in the prior art circuit, there is no reduction of the boosting voltage by a threshold of conduction voltage $V_{tn}$ as in the prior art.

Since non-overlapping clocks are used, the boosting current will not flow between the output terminal 19 and $V_{dd}$. This also prevents charge from leaking away from the capacitor 15 during switching.

It is preferred that the N-channel transistor substrates should all be connected to a voltage $V_{ss}$ or $V_{bb}$ which is below $V_{ss}$ (ground) in this embodiment. The connection of the substrates of the P-channel transistors 24 and 18 to $V_{pp}$ avoids forward biasing of the P-channel tubs.

Figure 6:
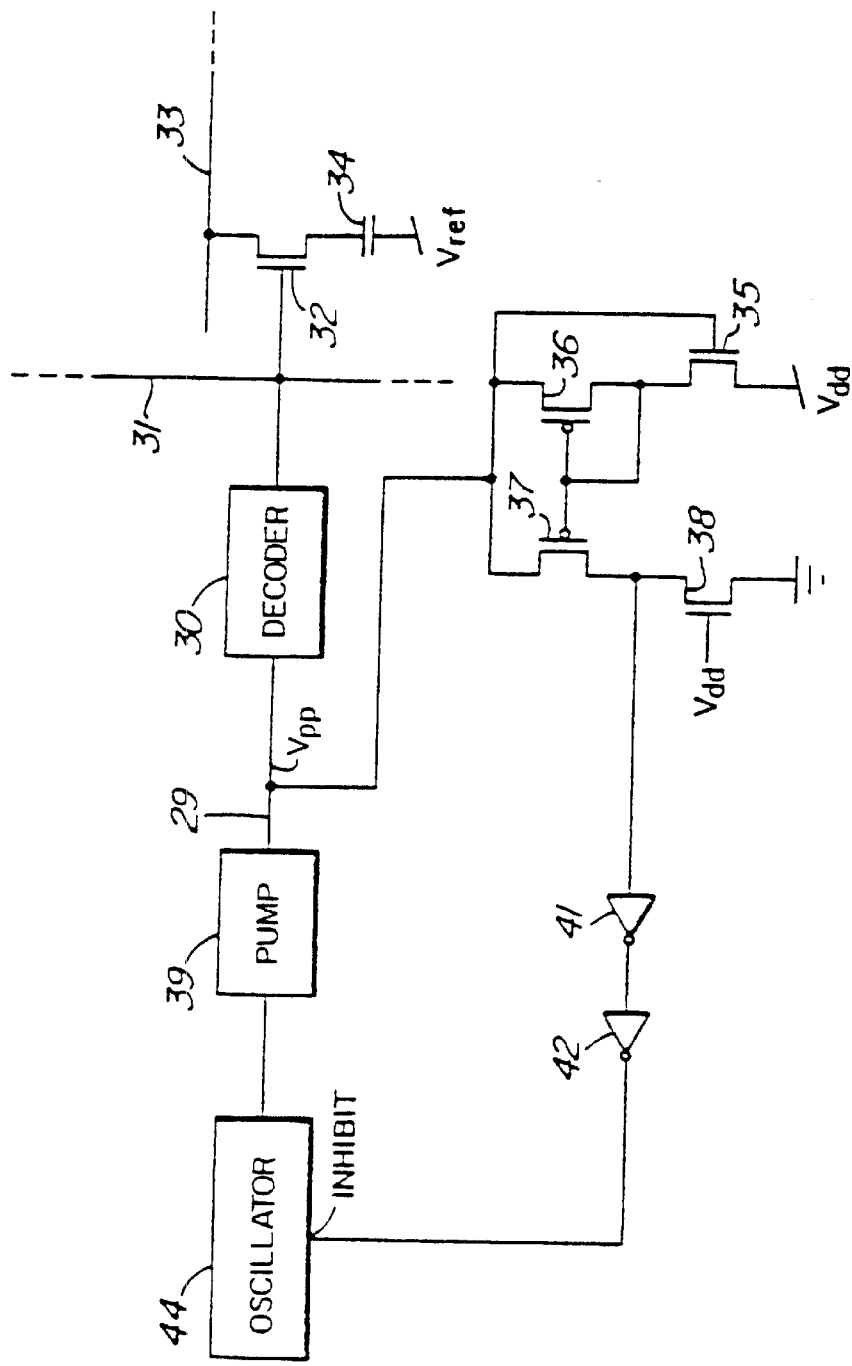
FIG. 6 is a partly schematic and partly block diagram illustration of another embodiment of the invention.

Turning now to FIG. 6, a word line supply is shown. A word line voltage source such as provided on lead 29 is connected through a word line decoder 30 to a word line 31. A memory cell access transistor 32 has its gate connected to the word line, and its source-drain circuit connected to a bit line 33 and to a memory cell bit storage capacitor 34. The capacitor is referenced to the cell plate reference voltage $V_{ref}$.

In operation of the above well-known circuit, if a voltage $V_{pp}$ on lead 29 is supplied through a word line decoder 30 to a word line 31, which voltage is applied to the gate of transistor 32, the bit storage charge capacitor 34 is connected to bit line 33 through transistor 32. The charge stored on capacitor 34 is thereby transferred to bit line 33.

The circuit of FIG. 6 provides a word line voltage regulator. A sample transistor 35 is fabricated identical to word line access transistor 32. It thus exhibits the same characteristics, including the same thresholds of conduction.

The source of transistor 35 is connected to the voltage supply $V_{dd}$ and the drain is connected through a P-channel transistor 36 to the word line voltage source lead 29. The gate of transistor 36 is connected to its drain.

A P-channel transistor 37 mirrors the current in transistor 36 having its gate connected to the gate and drain of transistor 36, its source connected to the word line voltage source lead 29 and the drain connected to the drain of N-channel transistor 38, which has its other source connected to ground ($V_{ss}$), and its gate connected to $V_{dd}$, to operate in the linear region as a resistor.

Transistors 36 and 37 form a current mirror of current passing through transistor 36. When $V_{pp}$ rises to the point at which transistor 35 begins to conduct, a similar current is conducted through transistor 38. A positive voltage appears between the junction of transistors 37 and 38 and ground. This voltage is used as a feedback voltage to inhibit the generation of additional increase in voltage of $V_{pp}$ on lead 29.

Since transistor 35 is identical to transistor 32, the exactly correct $V_{pp}$ sufficient to turn on transistor 32 is set.

The voltage $V_{pp}$ at lead 29 can be provided by means of a pump in accordance with the prior art, or preferably the voltage pump 39 described with reference to FIGS. 3 and 4 above. Either the prior art pump or the pump in accordance with the present invention is driven by an oscillator 40, which provides the clock signals, e.g. $\phi_1$, $\phi_2$, $/\phi_1$ and $/\phi_2$. Oscillator 44 has an inhibit input, which stops its operation upon receipt of an inhibit signal.

The feedback voltage from the current mirror is applied via a pair of serially connected inverters 41 and 42 to the inhibit input of oscillator 44. Actually, any even number of inverters could be used. Therefore when transistor 35 begins conduction, signifying that the correct word line (and transistor 32) driving voltage $V_{pp}$ has been reached, the feedback voltage to the inhibit input of oscillator 44 shuts oscillator 44 down, causing cessation of the charging of the capacitors in the voltage boosting circuits, and cessation of increasing of the voltage $V_{pp}$.

The voltage regulator described above thus eliminates the boosting of $V_{pp}$ if it is not required, and only allows the voltage boosting circuit to boost the voltage to the level required by the word line, i.e. cell access transistors. This saves power and provides protection to the cell access transistors, increasing reliability of the memory. The dangerous double boot-strap circuits boosting voltage to about $2V_{dd}$ which were previously found on the chip are thus eliminated, and voltage stress is minimized.

Narrow channel transistors can have higher than expected threshold voltages under back-bias conditions, and the present regulator which actually measures the memory cell access transistor turn-on voltage provides the exact word line supply voltage, neither too low nor too high. The combined embodiments of FIGS. 3 and 5 thus provide a substantially more reliable word line voltage, resulting in a more reliable memory, with reduced power requirements.

A person understanding this invention may now conceive of alternative structures and embodiments or variations of the above. All of those which fall within the scope of the claims appended hereto are considered to be part of the present invention.

What is claimed is:

1. A dynamic random access memory (DRAM) boosted voltage word line supply comprising:

DC voltage supply;

a boosting capacitor having first and second terminals; and a switching circuit including a first switch between the voltage supply and the first terminal of the boosting capacitor and a second switch between the first terminal of the boosting capacitor and a capacitive load, the first switch and the second switch being driven by clock signals, the switching circuit alternately connecting the first terminal of the boosting capacitor to a first voltage level and to the capacitive load while alternating the level of voltage applied to the second terminal of the boosting capacitor to pump the voltage on the capacitive load to a boosted voltage level greater than and of the same polarity as the DC voltage supply, the second switch being enabled to substantially eliminate a threshold voltage reduction of boosted voltage; and a word line decoder which selectively couples the boosted voltage level to a selected DRAM word line.

2. A DRAM word line supply as claimed in claim 1 wherein the second switch is a p-channel transistor.

3. A DRAM word line supply as claimed in claim 1 wherein the first and second switches are driven by non-overlapping clock signals.

4. A method of supplying a boosted voltage to a dynamic random access memory cell access transistor comprising:

providing a DC voltage supply having plural voltage levels and a boosting capacitor having first and second terminals; and with clock signals applied to switches, alternately switching the first terminal of the boosting capacitor to a first voltage level and to a capacitive load while alternating the logic level applied to the second terminal of the boosting capacitor to pump the capacitive load to a boosted voltage level greater than and of the same polarity as the DC voltage supply without a threshold voltage reduction of boosted voltage; and supplying the voltage on the capacitive load as a boosted voltage supply to a word line for enabling a memory cell access transistor which connects a memory cell capacitor to a bit line.

5. A method as claimed in claim 4 wherein the switch between the first terminal of the boosting capacitor and the capacitive load is a p-channel transistor.

6. A method as claimed in claim 4 wherein the clock signals applied to the switches are nonoverlapping clock signals.

* * * * *